(12) United States Patent
Li et al.

(10) Patent No.: US 6,404,927 B1
(45) Date of Patent: Jun. 11, 2002

(54) CONTROL POINT GENERATION AND DATA PACKING FOR VARIABLE LENGTH IMAGE COMPRESSION

(75) Inventors: Jun Li, Fremont; Iskender Agi, San Mateo, both of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/268,277

(22) Filed: Mar. 15, 1999

(51) Int. Cl.$^7$ ................................................. G06K 9/36
(52) U.S. Cl. ........................ 382/232; 382/245; 358/539
(58) Field of Search ................................. 382/232, 242, 382/244, 245, 246; 358/261.1, 427, 428, 539

(56) References Cited

U.S. PATENT DOCUMENTS 4,847,677 A * 7/1989 Music ......................... 358/13
4,914,508 A * 4/1990 Music ......................... 358/13
4,968,135 A * 11/1990 Wallace et al. ........... 358/261.1

FOREIGN PATENT DOCUMENTS

EP          341272 B1 * 9/1993 ........... H04N/1/413

* cited by examiner

Primary Examiner—Jerome Grant, II
(74) Attorney, Agent, or Firm—Townsend and Townsend and Crew LLP

(57) ABSTRACT

A simple, cost-effective compression circuit which compress raw color data without interpolation. Control points common to all the colors in a line are generated each time one of the colors exceeds the color change threshold. The change in the other color is recorded at the same time even though it doesn't exceed the minimum change threshold.

14 Claims, 5 Drawing Sheets

CONTROL POINT GENERATION AND DATA PACKING FOR VARIABLE LENGTH IMAGE COMPRESSION

BACKGROUND OF THE INVENTION

The present invention relates to compression of color image data, and in particular to compression using control point generation for run length encoding.

Image data coming out of one-chip area sensing imagers, such as one-chip Charged Coupled Device (CCD) or Complementary Metal Oxide Silicon (CMOS) Focal Plane Array (FPA) image sensors, are inherently sub-sampled in spatial domain. Most of the commercial imager products use a pattern of either three or four colors to construct a mosaic Color Filter Array (CFA), which performs the sub-sampling in each color plane. This results in the interlaced output data of the color components in each line from the imagers.

FIG. 1 illustrates a portion of an image sensor 10 (a Bayer CFA on FPA CCD/CMOS sensor). Each physical location corresponds to a single color which is generated either by a filter for that color, or by reflecting off of a document from a Light Emitting Diode (LED) of that color at that position. For example, shown is a Red, Green, Blue (RGB) mosaic which shows in line 1 alternating blue and red positions, line 2 alternating red and green positions, then in line 3 blue and red again, etc. To establish all three color values at a particular pixel location, such as location 12, the green value can be used directly since it is on position 12. Since no red value is exactly on that position, the red value can be interpolated from the surrounding red values. Similarly, the blue value can be interpolating from the surrounding blue values. Similarly, all three color values can be either read or interpolated for each pixel position.

Variable length image compression algorithms will record a color value, and then indicate a length along the line to a change in that color value. Thus, the color value need not be recorded and transmitted at every location, but only when it changes. Two typical algorithms are used for such variable length image compression.

(1) A first method recovers the sub-sample color planes by interpolation to obtain luminance information. In other words, the RGB is converted into a YUV format. Alternately, another color scheme rather than RGB may be used, such as Cy, Ye, G, Mg. The luminance value in this version is then used to generate a single set of control points for all interpolated components. A "control point" identifies where a change in the luminance occurs which is more than a change threshold. A disadvantage of this approach is that it requires data interpolation, which can costly, and it actually boosts the data volume prior to subsequently compressing it. In addition, generating control points based only on luminance information can cause color distortion. After the control points are generated, the run length and color change information is provided to a Huffman Look-Up Table (LUT) which provides a compressed output. One example of a compression technique using a Huffman lookup table was set forth in U.S. Pat. 5,675,382. Typically, the prior art will use multiple Huffman encoding tables as in the above patent, or will use a single, large Huffman encoding table.

(2) A second approach is to generate control point sets separately for each color component in a line. Thus, for example, control points may be generated separately for red, then separately for green, and separately for blue. A disadvantage to this approach is that the run length information between the control points contains some redundant length information, especially in image areas with high frequency content. The separate control point sets also make it difficult to apply parallel processing techniques to realize fast software decompression.

SUMMARY OF THE INVENTION

The present invention provides a simple, cost-effective compression circuit which compresses raw color data without interpolation. Color points common to all the colors in a line are generated each time the change in any one of the colors exceeds the color change threshold. The change in the other color is recorded at the same time even though it doesn't exceed the minimum change threshold.

Providing a common run length for multiple colors allows efficient, parallel decompression in a processor which has parallel processing capability for multiple pixel values. This parallel processing capability offsets the extra computation needed since raw color data is sent, rather than interpolated color data. However, even without the offset, the processing power of a typical host computer allows the interpolation to be done at the host.

In a preferred embodiment, the amount of circuitry required for data compression is further reduced by using a single, small Huffman look-up table (LUT). this is done by providing each color value and then the run length in sequence as inputs to the same, small LUT. In one embodiment, a data packer circuit converts the uneven bit length of these three items into a common bit length. In particular, the color value changes may be encoded as 8 bits plus a sign bit, for a total of 9 bits. The run length may be encoded as 6 bits. The data packer takes one bit from each of the color values and adds it to the run length data group, to give three groups of 8 bits.

In a further aspect of the invention, the data packing is done by using the sign bit from each of the color bits to add to the run length bit field. By using the sign bits, the encoding efficiency of the Huffman LUT is maximized, by not breaking up the color difference values. By using the sign bits as the least significant bits of the run length data block, it minimizes the impact on variations of the run length.

For further understanding of the nature and advantages of the invention, reference should be made to the following description taken in conjunction with the accompanying drawings.

DESCRIPTION OF THE SPECIFIC EMBODIMENTS

The invention performs piecewise linear and variable length compression on raw data instead of interpolated data in order to reduce hardware cost and computation error introduced by interpolation algorithms. The prior art requires additional data storage for the previous line(s) and logical circuits to recover the missing color components due to the application of CFA on FPA. Holding the interpolation procedure until image decompression has been completed makes it possible to take advantage of the computation power of state of the art computers and to provide a flexible interpolation schedule.

The invention generates a single control point set for all interlaced color components of the same line from the imager. It generates all the control points while the data of a line from the imager is streaming in, and there is no line data storage required. The invention uses a criterion to determine when a control point needs to be generated. Based on the piecewise linear and variable length algorithm used, the criterion may vary. The same criterion works on each color component separately to determine whether or not a control point should be generated at current position. If a control point is necessary for one color component at the current position, the invention makes it the control point of all other color components of the current line. Thus all the color components in one line share the same run length attribute although other attributes in their attribute vectors are different.

Prior art piecewise linear and variable length image compression algorithms either use luminance information to generate a single set of control points for all interpolated color components, or generate control point sets for each color component in a line separately. The invention generates control points taking the variation in the original data stream of all color components into account. Not only does the invention decrease color distortion, but it also reduces redundant information. A single set of control points for all the color components also makes it easier to implement faster decompression using parallel processing techniques.

Figure 1:
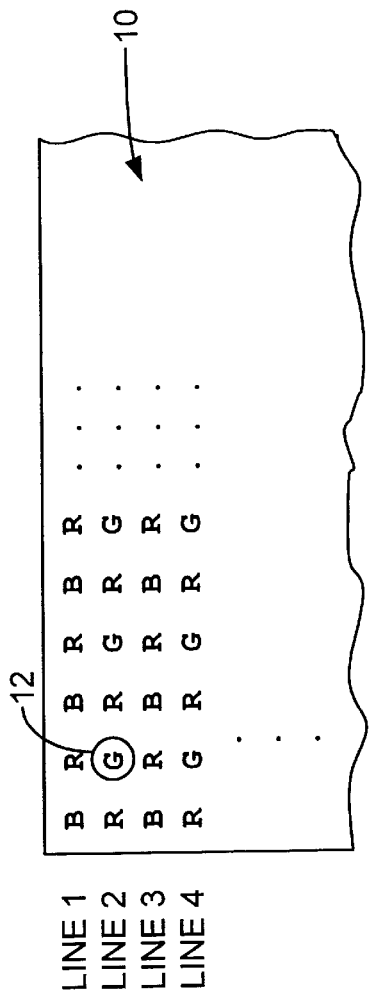
FIG. 1 is a diagram of a prior art color filter array illustrating color placement.
Figure 2:
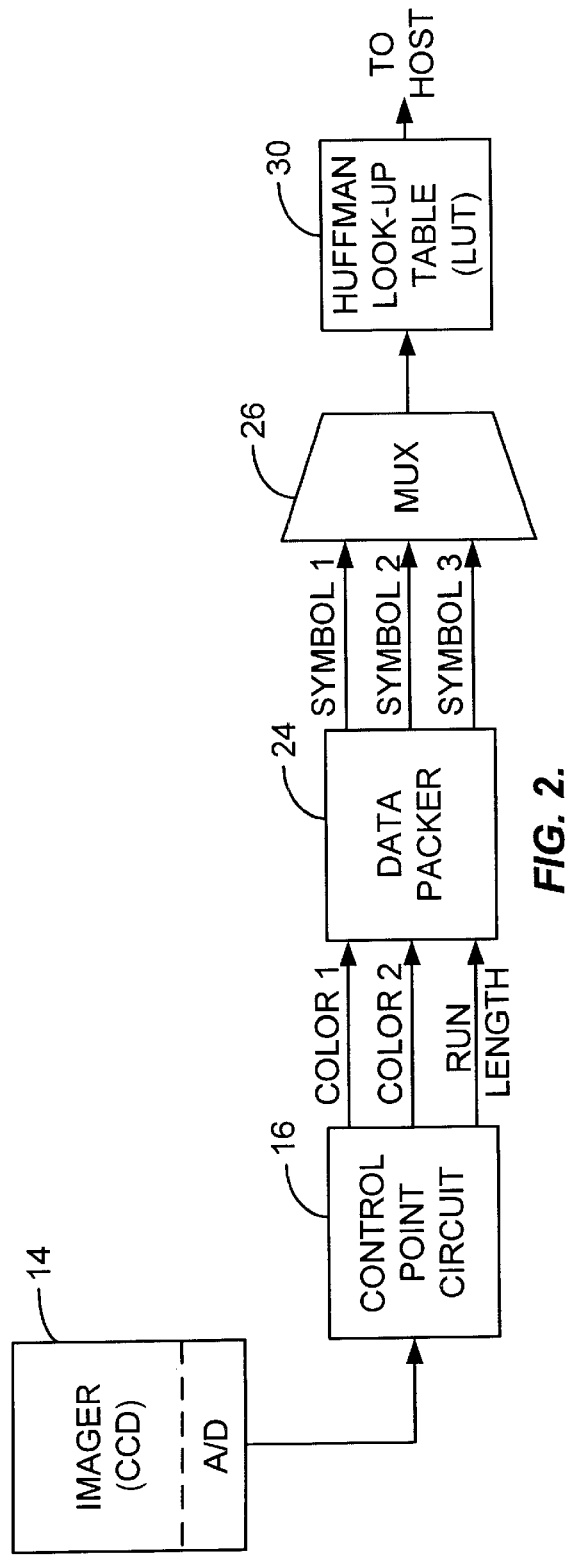
FIG. 2 is a block diagram of a compression circuit according to an embodiment of the invention.
Figure 3:
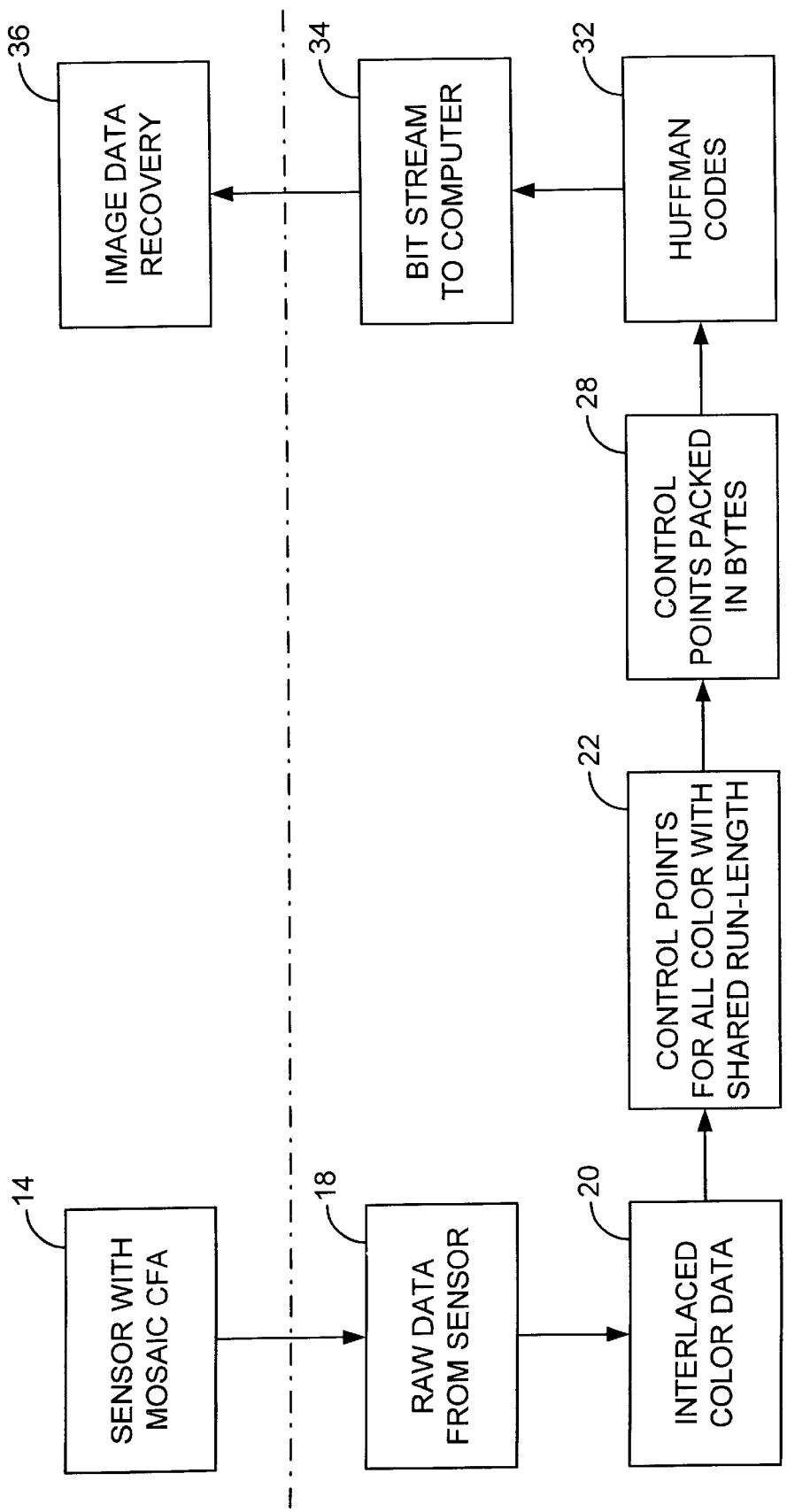
FIG. 3 is a data flow diagram illustrating variable length image compression according to an embodiment of the invention.

FIG. 2 is a block diagram of the invention with FIG. 3 illustrating the data flow. An imager or sensor 14 such as a CCD, with a mosaic CFA is provided. The data from imager 14 is provided to a control point circuit 16. This data is the raw color data 18 shown in FIG. 3, which is interlaced color data 20 in nature.

Control point circuit 16 then provides outputs in the form of color 1, color 2 and a run length (Color 1 and color 2 are changes in those colors). As illustrated in FIG.3, this data 22 provides a shared run length for the two colors. For example, if one color has changed to exceed the changed threshold and the other has not, the second color has its value updated anyway so that they can start again from the same control point.

The colors and run length are provided to a data packer 24, which packs the data into three equally sized and equally treated bytes symbol 1, symbol 2 and symbol 3 provided to a multiplexer 26. This is illustrated as data block 28 in FIG. 3. Multiplexer 26 then sequentially provides each of the three 8 bit values to a Huffman look-up table (LUT) 30, from which a compressed version of the data is transmitted to the host computer. As illustrated in FIG. 3, Huffman codes 32 are generated by table 30, and provided as a bit stream 34 to a host computer which can perform decompression and then interpolation to provide image data 36.

Figure 4:
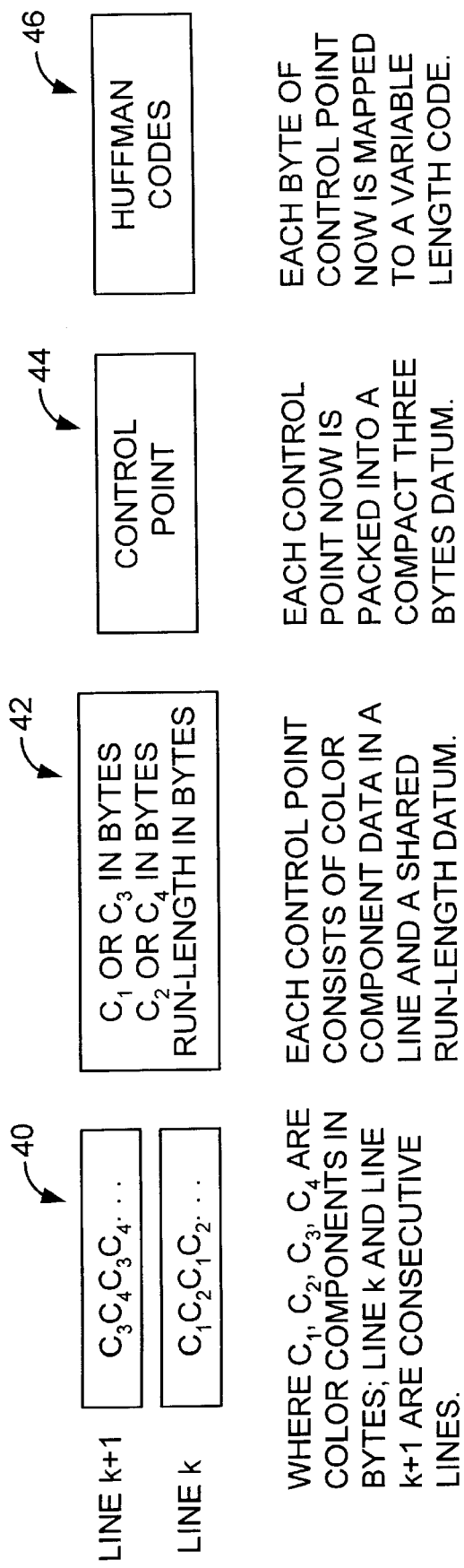
FIG. 4 is a diagram illustrating the data formats used in the variable length image compression of an embodiment of the invention.

FIG. 4 illustrates the data formats used in the system of FIGS. 2 and 3. Two lines 40 are shown, each with alternating color values, either $C_1$ and $C_2$ or $C_3$ and $C_4$. As illustrated, the color components in a control point are represented as a change in a color value from a previous value, using an 8 bit byte plus a sign bit in a preferred embodiment. Control point 42 consists of 2 bytes of color component's absolute change values, a byte consisting of the shared run-length, and the two sign bits of the color value changes. The control point is packed into a packed control point 44. As described in one embodiment below, this can be converting two 9 bit values for the color and a 6 bit value for the run-length into three 8-bit values. Finally, Huffman codes 46 are produced, which are variable length compression codes.

The invention packs the control point sets into a compact stream format to further reduce the hardware implementation cost of the compression algorithm. Prior art variable length image compression algorithms employed a large LUT or multiple LUTs for Huffman encoding of different color component attributes. The invention converts the values of all color component attributes into the eight-bit bytes with similar probability distributions and then stream the converted attribute values into a small LUT to obtain Huffman codes. The Huffman codes are then transferred to the host computer. When decompression is subsequently performed in the host computer, the attributes of the color components are retrieved and thus an image of all color components in the original pattern is obtained. The compression can be lossy or lossless depending on the criterion which decides when to generate a control point. Quality or compression ratio can be controlled by adjusting the criterion and no change needs to be done for decompression.

Piecewise Linear Compression

A piecewise linear compression algorithm approximates a two dimensional representation of an image by a finite number of connected line segments each of which is described by a linear function. The start points and end points of the segments in the line segment sequence are called "control points." In the compression procedure of the invention, piecewise linear coding is the first compression step. It is performed on raw line data, instead of color interpolated line data, in order to reduce hardware cost and computation error introduced by interpolation algorithms.

To code the current line, the prior art requires at least additional data storage for the previous line and logical circuits to recover the missing color components due to the application of CFA on FPA. Holding the interpolation procedure until image decompression has been completed makes it possible to take advantage of the computing power of state of the art computers and to provide a flexible interpolation schedule. By having only a single control point set for all interlaced color components of the same line, all the control points are generated while the data of the line from the imager is streaming in, and there is no requirement for the data storage of the previous line.

Each of the line segments is coded by its length and the color value change between its control points. At the beginning of the line, the first pixel is defined to be the end point of the first segment. This segment has a start point defined at the same position as the first pixel but with intensity value zero. Differential coding is used for the control point sequence so that each segment's color value change is defined as the intensity difference between its end point and start point. Thus the segment is of a zero length that signals the start of the line.

To ensure a desired piecewise linear approximation quality, a constraint is imposed to limit the error by a threshold. This is reflected in the criterion that is defined to determine when a control point should be generated. Based on the piecewise linear algorithm used, the criterion may vary. One can simply use all the pixels as control points. This will not give any positive contribution to the compression ratio but rather gives an expensive way of skipping the first compression step.

Run-Length Encoding

Run-length coding can be implemented in either lossy or lossless (setting error tolerance threshold to zero) compression.

When a lossy run-length algorithm is used, an error tolerance threshold $\epsilon$ can be given. Consider a color component X, the beginning of a line is always a control point, and starting from there, streaming data is examined one by one and their intensity values are compared to the last control point. When the difference between the pixel at current position j+1 and the last control point at position i is over the error tolerance threshold, a new control point will be triggered at position j. In other words, tracing the data stream starting from the control point at i, if j is the first pixel which makes $|v(j+1)-v(i)| \geq \epsilon$, where v(i) stands for value of pixel i, then the current run-length is j−i and pixel j becomes a new control point.

Figure 5:
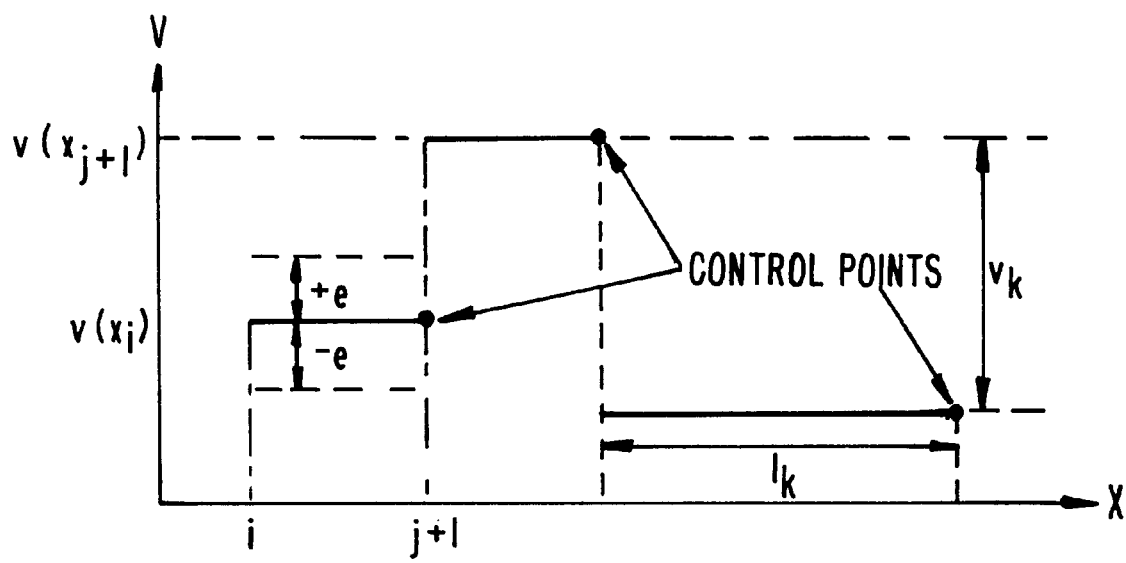
FIG. 5 is a graph illustrating a run length coding scheme

FIG. 5 shows a run-length encoding example, where three segments are presented. In the figure, v(i) and v(j+1) are the values of the starting points of the first and second segments, respectively, and $(v_k, l_k)$ is the attribute value set used to code the last segment, say the kth segment.

Run-length coding is widely used in graphics compression, but it is not a good model for continuous tone images. For continuous tone images, slope-length coding is a better model.

Slope-Length Encoding

A slope-length algorithm is similar to run-length coding, except it measures the difference of a pixel value's changing rate instead of a pixel value difference. In a slope-length algorithm, assume we trace the data stream starting from the control point at position i. If j is the first pixel which makes $|s(i \rightarrow j+1)-s(i \rightarrow j)| \cdot (j+1-i) \geq \epsilon$, where $s(i \rightarrow j)$ stands for slope from pixel i to pixel j, then the current slope-length is j−i and pixel j becomes the new control point.

Figure 6:
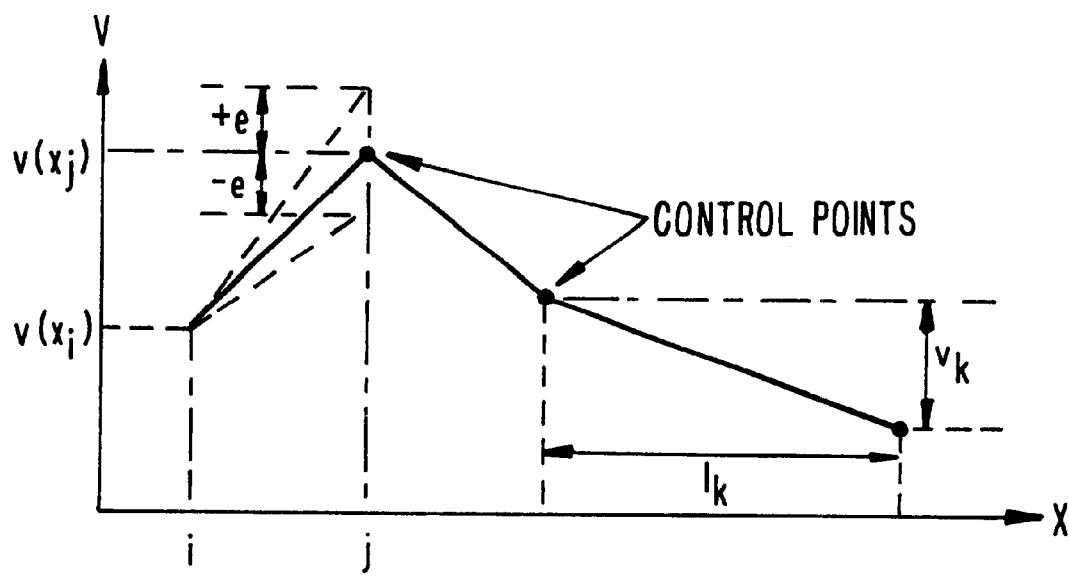
FIG. 6 is a graph illustrating a slope length coding scheme.

FIG. 6 shows a slope-length coding example consisting of three segments, where v(i) and v(j) are the values of the starting points of the first and second segments, respectively, and $(v_k, l_k)$ is the attribute value set used to code the last segment, assuming it is the kth segment.

To avoid the problem introduced by error accumulation, additional error tolerance thresholds can be applied.

Besides run length coding and slope length coding, $L_\infty$-distortion limited piecewise linear coding algorithms can also be used for near lossless compression. This approach contains the line segment to be bound in the error tunnel defined by an error tolerance to all individual pixels.

A hard limit on the length of segments can be applied in each of algorithms described above, not only for error reduction but also for the ease of data packing.

In the present invention, the same criterion works on each color component simultaneously to determine whether or not a control point should be generated at current position. Data of all color components are traced separately; but whenever a control point needs to be generated for one color, it is forced to become the common control point for all color, and then the parallel tracing with respect to each color starts from this control point again. The procedure repeats until the end of the line. Therefore, all the color components in a line share the same length attribute although other attributes such as color and value are different. In this way, the variation of all color components in the original data stream is taken into account by their attribute vectors. Compared to the prior art, not only does this technique decreases color distortion, but it also reduces redundant information.

During decompression, an image of all color components in the original pattern can be obtained by linear interpolation of the control points. Since the color components in the same line share the same segment length, parallel processing techniques can be employed to implement fast decompression. For most software applications, this linear interpolation can be combined with the more sophisticated color interpolation to decrease the software execution time.

The quality or the compression ratio can be controlled by adjusting the criterion and thus no change needs to be done for decompression.

Variable Length Huffman Compression

Huffman coding is used as a second compression step in the present invention. As a lossless compression algorithm, Huffman coding maps the most frequently occurring data into a shorter code to reduce the total bits required to represent the image.

In order to reduce the hardware implementation cost of the compression algorithm, the control points are packed into a compact format. Instead of using large or multiple LUTs to encode the segment length and color values, attributes consisting of shared segment length and separate color values are converted into 8-bit symbols respectively. The similarity between segment length distribution and color value distributions makes it possible to feed the attribute symbols into a single small LUT to obtain Huffman codes.

Figure 7:
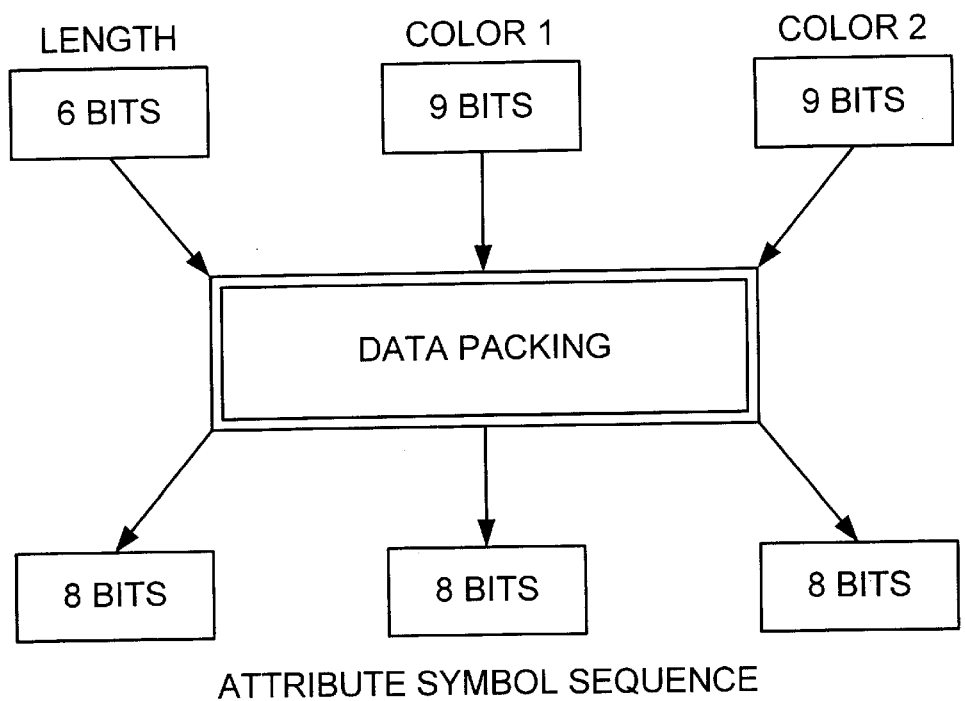
FIG. 7 is a diagram of data packing according to one aspect of the invention.

FIG. 7 illustrates the packing scheme. The code table for Huffman compression is generated by the statistics of images from typical scenes. The bit stream of Huffman codes is then transferred from the camera to the PC. When decompression is performed, the segment length and color values of all control points are retrieved via Huffman decoding and data unpacking. There are many Huffman decoding approaches. The most frequently used approach is to use a tree structure to decode the data stream bit by bit. Although this algorithm has a much less computational time complexity than a trivial traversing, it still consumes a lot of CPU power.

To achieve faster Huffman decoding, a LUT is used to map the codes back to the attribute symbols. Assume the maximum length of the Huffman code is $N=2^n$ the output of the LUT has two fields: one is 8 bits wide for the symbol and the other one is n bits wide for the code length. Thus the LUT size is $2^N(8-n)$. The minimum size LUT takes less than 100 KB. For ease of programming the invention uses one byte for the attribute symbol and one byte for the code length. Therefore, the invention has a 128 KB LUT, which is affordable for an advanced PC.

This Huffman decoding algorithm needs only one LUT operation and a few bit operations to complete the retrieval of a symbol. The input data stream is taken byte by byte to construct two-byte words for LUT operation. The code length field of the LUT output is then used to construct the next word. The decompression procedure requires no knowledge about the attribute sequence. Only a single static LUT is needed.

Data Packer

Figure 8:
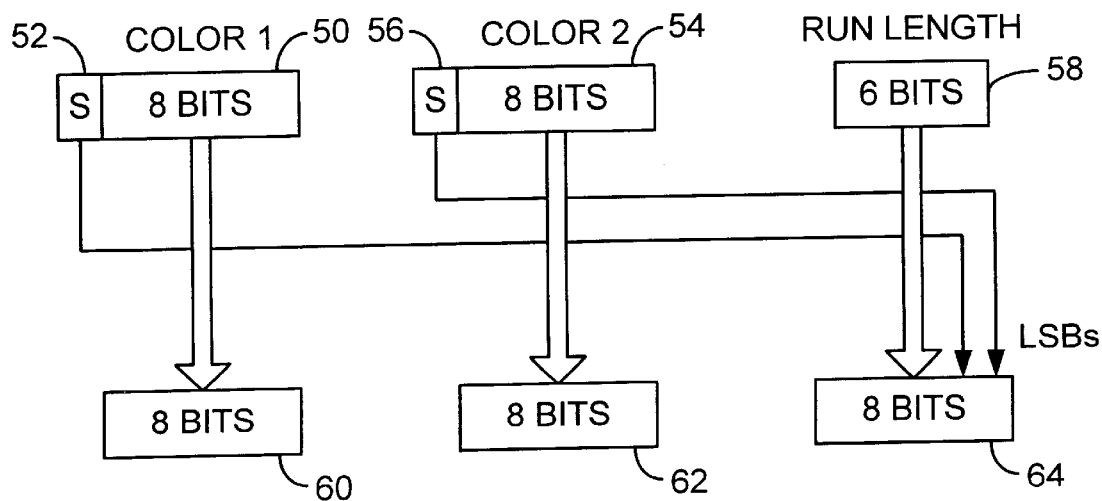
FIG. 8 is a diagram illustrating a particular embodiment of the data packing of FIG. 7.

FIG. 8 illustrates one embodiment of the data packing process. As shown in FIG. 8, color 1 is represented by a nine bit data block 50 consisting of 8 bits and a sign bit 52. Color 2 is represented by a data block 54 consisting of 8 bits and a sign bit 56. The run length is represented by a 6 bit block 58. The 8 bits from 50 and 54 are used directly as the first two 8 bit symbols 60 and 62. A third 8 bit symbol 64 consists of 6 bits from run length block 58, along with the two sign bits 52 and 56, which form the least significant bits (LSB) of 8 bit byte 64. Each of these 8 bit symbols may then be provided in sequence the same Huffman look table. A small (8 input) Huffman LUT can thus be used, eliminating the need for multiple Huffman tables or a very large Huffman table.

As will be understood by those skilled in the art, the present invention may be embodied in other specific forms without departing from the essential characteristics thereof For example, three colors might be used per line. Alternately, the run length might be a larger field than the color fields, with a different data packing distribution required. Accordingly, the foregoing description is intended to be illustrative, but not limiting, of the scope of the invention which is set forth in the following claims.

What is claimed is:

1. A method for providing color image data from an image sensor to a host computer, comprising:
   providing at least two color values for a plurality of locations along a line of an image;
   generating control points along said line which are common to said two color values, said control points indicating a run length which is common to said two colors;
   compressing said color values to in dictate changes in both said color values between said control points, without in the interpolating said color values to provide color values at the same locations along said line;
   converting a digital representation of each of said color values and a run length since a last control point into equal sized data blocks; and
   providing each of said data blocks in sequence to a single compression block.

2. The method of claim 1 wherein said single compression block is a Huffman encoding look-up table.

3. The method of claim 1 wherein said converting step comprises adding a sign bit from each of said color values to a data block including said run length.

4. The method of claim 3 wherein each of said color values is represented by an 8 bit byte and a sign bit, and said run length is represented by 6 bits.

5. The method of claim 1 further comprising imposing a limit on said run length to allow representation within a run length data block.

6. A method for providing color image data from an image sensor to a host computer, comprising:
   providing at least two color values for a plurality of locations along a line of an image;
   generating control points along said line which are common to said two color values, said control points indicating a run length which is common to said two colors; and
   compressing said color values to indicate changes in both said color values between said control points, without interpolating said color values to provide color values at the same locations along said line;
   further comprising, in said host computer:
   decompressing said color values; and
   interpolating said color values.

7. A method for providing color image data from an image sensor to a host computer, comprising:
   providing at least two color values for a plurality of locations along a line of an image;
   generating control points along said line which are common to said two color values, said control points indicating a run length which is common to said two colors;
   compressing said color values to indicate changes in both said color values between said control points, without interpolating said color values to provide color values at the same locations along said line;
   converting a digital representation of each of said color values and a run length since a last control point into equal sized data blocks; and
   providing each of said data blocks in sequence to a single compression block.

8. The method of claim 7 wherein said single compression block is a Huffman encoding look-up table.

9. The method of claim 7 wherein said converting step comprises adding a sign bit from each of said color values to a data block including said run length.

10. An apparatus for providing color image data from an image sensor to a host computer, comprising:
    an image sensor having an output for providing at least two color values for a plurality of locations along a line of an image;
    a control point generation circuit coupled to said output of said image sensor, said control point generation circuit being configured to generate control points along said line which are common to said two color values, said control points indicating a run length which is common to said two colors;
    a compression circuit coupled to said control point generation circuit and configured to compress said color values to indicate changes in both said color values between said control points, without interpolating said color values to provide color values at the same locations along said line;
    a data packing circuit coupled to an output of said control circuit and configured to convert a digital representation of each of said color values and a run length since a last control point into equal sized data blocks; and
    a switching circuit, connected between said data packing circuit and said compression circuit, to provide each of said data blocks in sequence to said compression circuit.

11. The apparatus of claim 10 wherein said compression circuit is a single Huffman encoding look-up table.

12. The apparatus of claim 10 wherein said data packing circuit is configured to add a sign bit from each of said color values to a data block including said run length.

13. The apparatus of claim 12 wherein each of said color values is represented by an 8 bit byte and a sign bit, and said run length is represented by 6 bits.

14. The apparatus of claim 10 wherein said control point generation circuit is configured to impose a limit on said run length to allow representation within a run length data block.

* * * * *